United States Patent [19]

Huignard et al.

[11] 4,449,785

[45] May 22, 1984

[54] MULTIPLE HOLOGRAM BULK OPTICAL STORAGE DEVICE

[75] Inventors: Jean-Pierre Huignard; Jean-Pierre Herriau, both of Paris, France

[73] Assignee: Thomson-CSF, Paris, France

[21] Appl. No.: 299,224

[22] Filed: Sep. 3, 1981

Related U.S. Application Data

[63] Continuation of Ser. No. 11,924, Feb. 13, 1979, abandoned, which is a continuation of Ser. No. 781,450, Mar. 25, 1977, abandoned.

[30] Foreign Application Priority Data

Mar. 30, 1976 [FR] France ................. 76 09209

[51] Int. Cl.³ .................. G03H 1/02; G03H 1/28
[52] U.S. Cl. .................. 350/3.61; 350/3.77; 350/DIG. 1
[58] Field of Search ............... 350/3.64, 3.75, 3.77, 350/DIG. 1, 3.61

[56] References Cited

U.S. PATENT DOCUMENTS

| | | | |
|---|---|---|---|
| 3,296,594 | 1/1967 | Van Heerden | 350/3.77 |
| 3,544,189 | 12/1970 | Chen et al. | 350/3.64 |
| 3,652,145 | 3/1972 | Thaxter | 350/3.64 |
| 4,017,144 | 4/1977 | Staebler | 350/3.64 |
| 4,063,795 | 12/1977 | Huignard | 350/3.64 |

*Primary Examiner*—Bruce Y. Arnold
*Attorney, Agent, or Firm*—Cushman, Darby & Cushman

[57] ABSTRACT

A multiple bulk optical storage device capable of storing information by the photovoltaic effect is disclosed wherein a thick photosensitive electro-optic material is illuminated by a reference beam incident on one face thereof and an object beam, without a zero order stop, is incident on a different face thereof. Transparent electrodes are attached to all of the faces of the crystal and electrically short circuited to one another.

6 Claims, 3 Drawing Figures

MULTIPLE HOLOGRAM BULK OPTICAL STORAGE DEVICE

This is a continuation of application Ser. No. 11,924, filed Feb. 13, 1979 (now abandoned) which is a continuation of Ser. No. 781,450, filed Mar. 25, 1977 (now abandoned).

BACKGROUND OF THE INVENTION

The present invention relates to optical storage devices and more particularly to bulk holographic storage devices.

The bulk storage of holograms is achieved by creating within the material interferences between a beam of radiation known as the reference radiation which is generally a parallel beam, and a radiation beam known as the object beam which carries the information and is generally of large apertural angle. These two beams are incident upon the same face of the storage material.

In order to superimpose holograms within a volume, the optical axis of the object beam remains fixed, while the optical axis of the reference beam rotates so that the different, successive holograms formed in the material are easily distinguishable at the time of reconstruction. The storage materials used have a high sensitivity. However, they cannot have their recording facilities fully exploited because geometric limitations, due to the aperture of the object beam incident upon the material which restricts the angular displacement of the reference beam for recording, which means that the maximum variations in refractive index cannot in fact be achieved.

SUMMARY OF THE INVENTION

The primary object of present invention is to provide a multiple hologram bulk optical storage device which makes it possible to largely avoid the geometric limitations as prior art devices, this device making it possible to very substantially increase the number of elementary holograms which can be superimposed within a given material, in comparison with the number of holograms which can be superimposed using a conventional storage device.

According to the invention there is provided a multiple hologram bulk optical storage device comprising a thick photosensitive electro-optical crystal simultaneously subjected, during storage, to a transmitted object beam having a fixed optical axis and to a reference beam having an optical axis variable around a mean optical axis, said fixed optical axis of said object beam inside of said material and said mean optical axis of said reference beam inside of said material being at right angle.

BRIEF DESCRIPTION OF THE DRAWINGS

For a better understanding of the invention and to show how the same may be carried into effect, reference will be made to following description and the attached drawings among which.

DESCRIPTION OF THE PREFERRED EMBODIMENT

In the following, detailed description it is assumed that the electro-optical storage material used is a material which, when illuminated, has a very low conductivity and a record-erase cycle which is highly asymmetric in nature. Holographic storage is performed by the photovoltaic effect (displacement of charges under the effect of the radiation), the variations in refractive index being produced by the charges thus created. Optical erasing is associated, unless some additional effect is created in the material, with the relaxation of the space charge field thus developed, the relaxation time being very long.

In the conventional manner, in order to effect holographic recording in a storage material, that region of the material in which it is desired to store the information is subjected to interferences produced by interaction between a substantially parallel reference beam and an object beam transmitted for example by a transparency constituting information, or diffracted by a three-dimensional object. Each zone of the hologram thus contains information corresponding to all points of the object which are visible from said zone, and therefore corresponds to a particular view of the object. The hologram exhibits a substantially sinusoidal variation in transmittance in planes parallel to the plane by bisecting the angle formed by the optical axes of the two beams. It is possible to compare this sinusoidal variation to a succession of planes corresponding to the interference maxima. At the time of reconstruction by means of a beam which may or may not be identical to that which was used at the time of storage, these planes behave both as reflective planes and as diffractive pupils.

A laser source is generally used to form both the reference beam and the object beam and, if it is desired to superimpose several holograms within a particular zone of the material, the procedure used, as described earlier is to produce a variation in the angle made between the optical axis of the reference beam and the normal to the beam entry face. The thus recorded strata have a direction which differs from the first ones, and, if they are sufficiently different, it is possible to reconstruct one of the corresponding object beams without reconstructing the other. The angular interval between the two reference beams should be greater than the angular selectivity in order for reconstruction to take place correctly. Assuming that the angle within which the optical axis of the reference beam can vary outside the material is $\theta_{p\,max.} - \theta_{p\,min}$, the number of images which can be superimposed will thus be:

$$\frac{\theta_{p\,max.} - \theta_{p\,min.}}{\Delta\theta_1},$$

$\Delta\theta_r$ being the angular selectivity.

Figure 1:
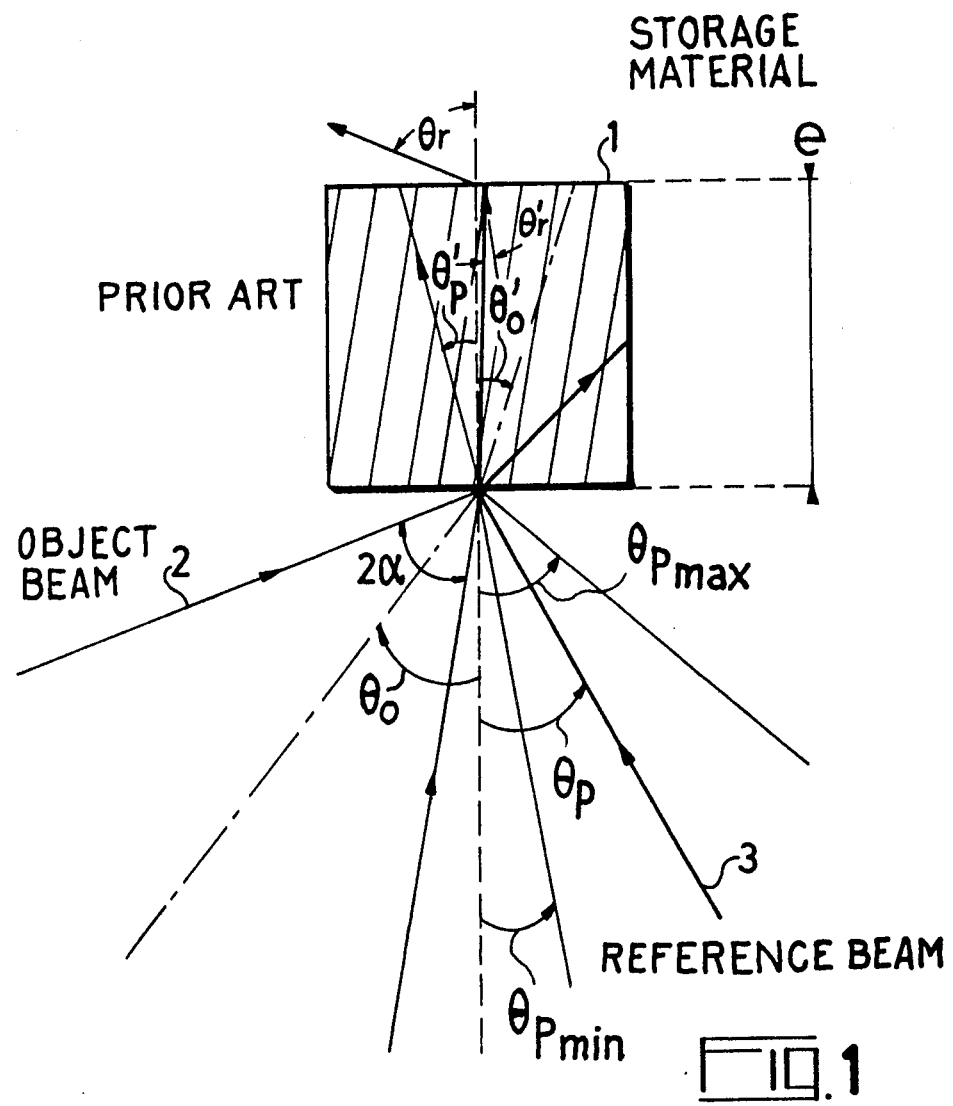
FIG. 1 illustrates schematically and in section a bulk holographic storage device in accordance with the prior art.

FIG. 1 illustrates a conventional storage device. It comprises a storage material 1 of thickness e, simultaneously illuminated by an object beam 2 of apertural angle $2\alpha$ and a reference beam 3 (only the optical axis has been shown).

In the following description, in order to simplify it the indices o, p and r will be assigned respectively to the quantities relating to the object wave, the reference wave and the reconstructing wave. $\theta_o$ and $\theta'_o$ are respectively the angles between the axis of the object beam and the normal to the entry face outside and inside the material; $\theta_p$ and $\theta'_p$ are respectively the angles between the axis of the reference beam and the normal to the entry face outside and inside the material; and $\theta'_r$ and $\theta_r$ are respectively the angles between the axis of the reconstituted beam and the normal to the exit face inside and outside the material. If we call $\lambda$ the wavelength of the reconstructing wave, then the angular selectivity inside of the material is:

$$d\theta'_r = \frac{\lambda \cos \theta'_o}{ne \sin(\theta'_o - \theta'_p)}$$

where n is the refractive index of the material in relation to air. The corresponding angular selectivity outside the material is:

$$d\theta_r = \frac{\cos \theta'_p}{\cos \theta_p} d\theta'_r.$$

This selectivity is the theoretical expression but in order to take into account the fact that the absorption within the material is not uniform and to avoid parasitic interference phenomena between the different recorded images, the range $\Delta\theta_r$ required in practice in order that successive images can be correctly reconstructed, should be increased beyond the theoretical value by an appropriate allowance. In practice, $\Delta\theta_r = kd\theta_r$, where k is the order of 5.

It is thus possible to state the order of magnitude of the number of images which can be superimposed within a cuboid piece of material of 5 mm side length, refractive index n=2.3, apertural angle $2\alpha = 60°$ approximately, subjected to a radiation of wavelength 0.51 μm, the recording conditions being such that the optical axis of the beam makes an angle $\theta_o = 40°$ with the normal to the entry face at which the radiation is incident, the optical axis of the reference beam making an angle $\theta_p$ with said normal, which can vary between 20° and 70°. If we take into account the fact that it is possible to distinguish $5 \times 10^4$ points in each image within a zone of surface area 0.25 cm$^2$, the corresponding storage density is of the order of $7 \times 10^7$ points per cubic centimeter. The angular selectivity can be reduced, other things being equal, by an appropriate choice of the angles $\theta'_o$ and $\theta'_r$ in relation to one another, such that $(\theta'_o - \theta'_r)$ is at a maximum, i.e. such that $\theta'_o$ and $\theta'_r$ (defined in relation to the same reference datum) have values which satisfy the equation $(\theta'_o - \theta'_r) = (\pi/2)$. This is tantamount to choosing the optical axis of the object beam as refracted in the material and the mean direction of the refracted reference beam, in such a way that they are at right angles to one another. The arrangement illustrated in FIG. 2 provides with, an object beam of wider apertural angle a wide range of angular variation for the reference beam.

Figure 2:
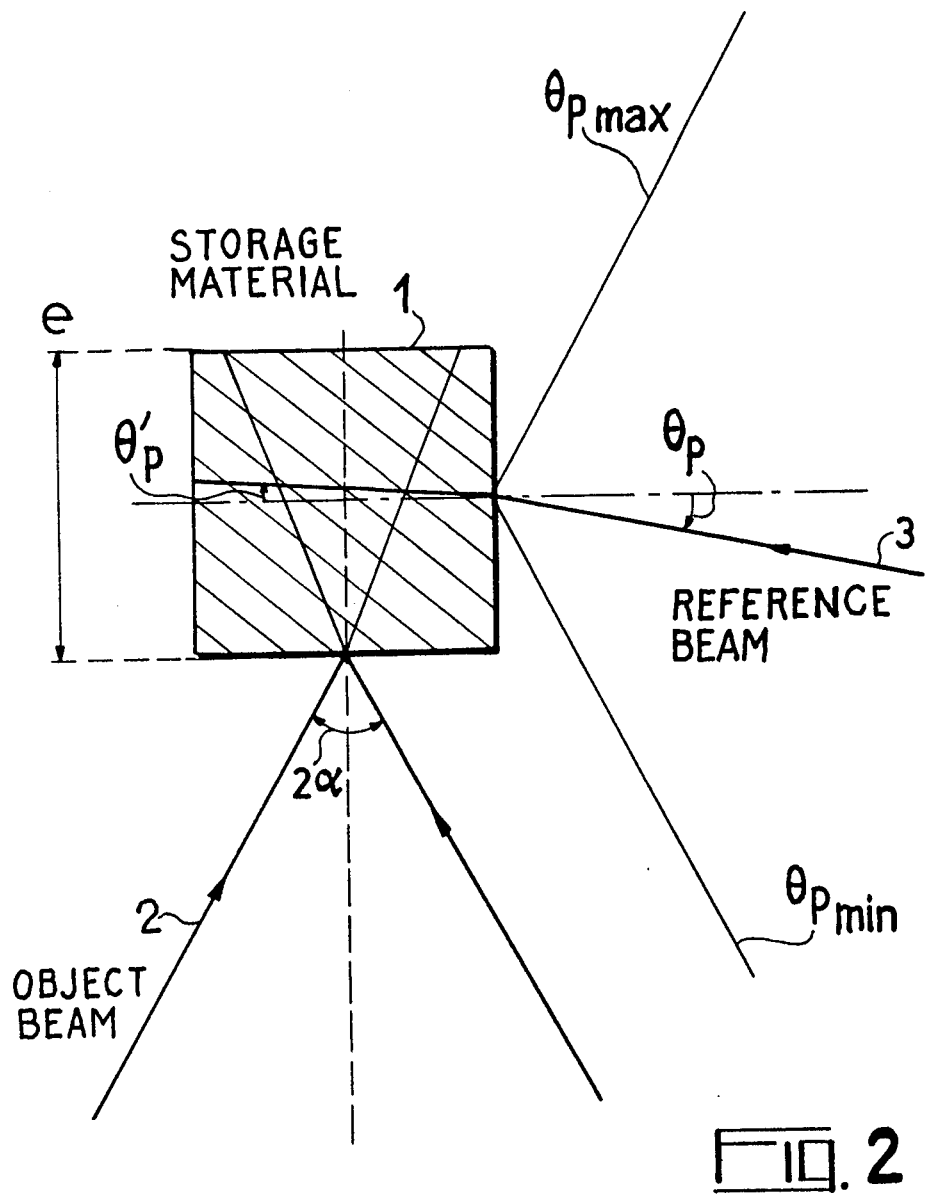
FIG. 2 schematically illustrates a section through a holographic storage device in accordance with the present invention.

FIG. 2 schematically illustrates the storage device in accordance with the invention. It comprises a storage material 1, of thickness e, simultaneously illuminated by an object beam 2 of apertural angle $2\alpha$ and a reference beam 3, these two beams being incident upon two faces of the material which are at right angles to one another. The device has a first advantage from the point of view of resolution: the aperture of the beam can be very large, even in the neighbourhood of 180°.

A second advantage arises by virtue of the wide range of angular variation achievable in the reference beam, this range being equal to 180° in the limiting case. It is possible to show that the angular selectivity is smaller since $\Delta\theta_r$, which is inversely proportional to sin $(\theta'_o - \theta'_p)$, is at a maximum for $(\theta'_o - \theta'_p) = (\pi/2)$, (with the optical axes of reference beam and object beam at right angle to one another within the material), the angular variation in the reference beam taking place about the normal and the optical axis of the object beam being coincidental with the normal to the corresponding entry face.

Experience shows and calculations confirm that the angular selectivity is substantially reduced and, consequently the number of images which can be superimposed is considerably increased using this kind of recording device. With a recording material similar to that used previously, an object beam of the same apertural angle $2\alpha = 60°$ and a reference beam whose optical axis has a range of variation of 70° to either side of the normal to the corresponding entry face, the number M of images which can be superimposed is of the order of 1800. The corresponding storage density is of the order of $3.6 \times 10^8$ points per cubic cm. This device therefore makes it possible to achieve a gain of 5 as far as the number of images superimposable within the same volume of material, or the storage point density, is concerned. The recording materials which can be used for this application may for example be a lithium niobate LiNbO$_3$ crystal which has been doped and reduced, with a highly asymmetric cycle, that is to say one which has a low conductivity, or, again, photopolymeric materials which are sensitive to the wavelengths of the visible spectrum. These latter materials, after recording, require a fixing operation which is performed by illuminating them with an ultraviolet radiation. These different materials can be obtained in the form of large-sized cubes of very high optical quality.

Figure 3:
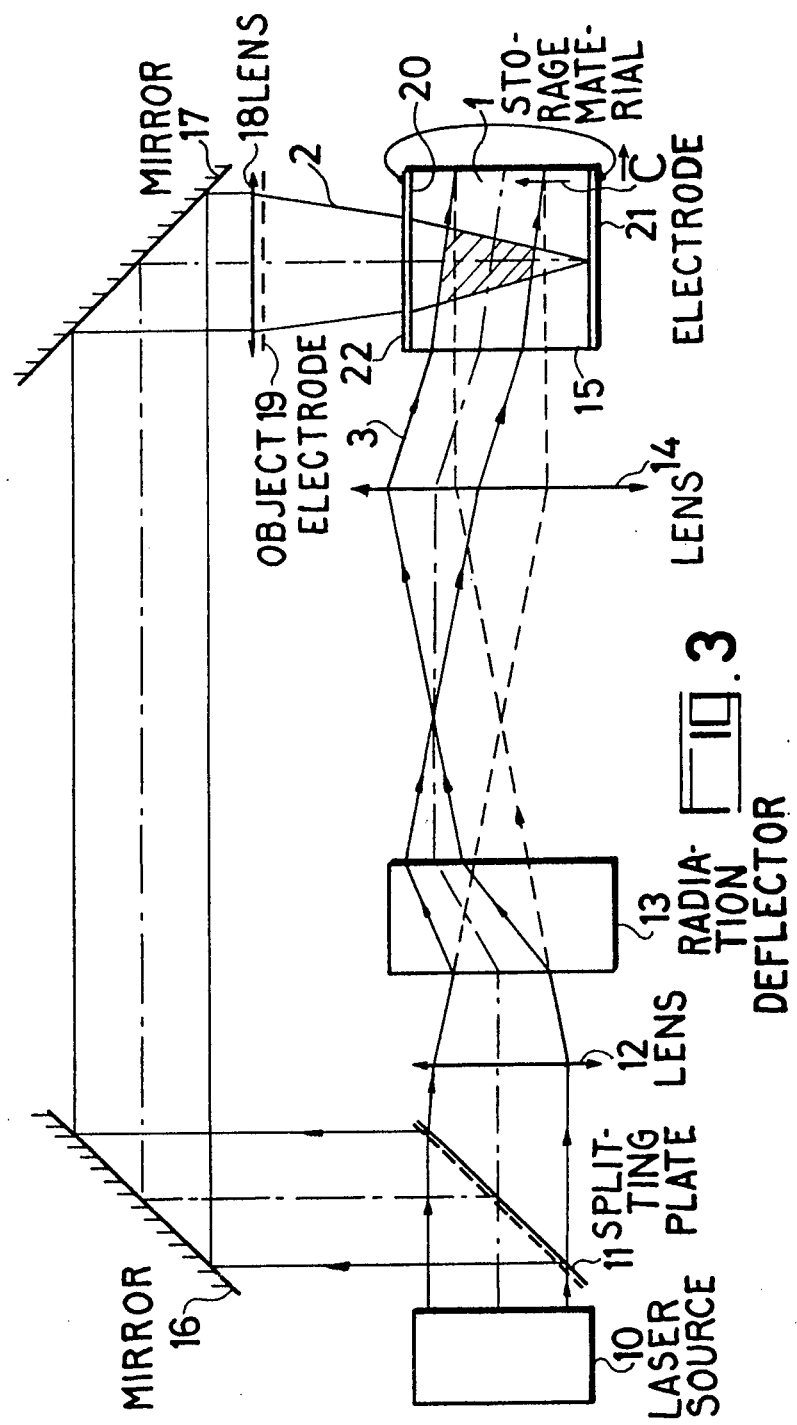
FIG. 3 illustrates a complete system for multiple hologram bulk storage in accordance with the invention.

FIG. 3 illustrates a multiple hologram bulk optical storage device in accordance with the invention. It comprises a laser type radiation source 10 and a splitting plate 11 splitting the radiation of the source into a first and a second beam. The first beam passes through a convergent optical device represented by a lens 12, a radiation deflector 13 and a convergent optical system represented by a convergent lens 14 which forms a parallel beam having variable optical axis in accordance with the translation introduced by the deflector 13. This reference beam is incident upon the face 15 of the cuboid storage material 1. The second beam formed by the splitting plate 11 is successively reflected by two mirrors 16 and 17 and passes through a convergent lens 18 to form a beam of apertural angle $2\alpha$. An object 19 whose hologram is to be formed by a technique of transmission, is arranged between the lens 18 and the face 20 of the storage material 1. The radiation emerging from the object 20 interferes within the material with the corresponding reference beam in order to create variations in refractive index within the material. The cuboid storage material which we will assume to be a crystal such as LiNbO$_3$, within which the axis $\vec{C}$ along which the photoinduced charges migrate is at right angle to the entry face 20 of the object beam, has two transparent electrodes 21 and 22 which are located respectively upon those faces of the crystal which are at right angle to the axis $\vec{C}$ and connected together in order to maintain a zero potential difference between said faces so that the elementary storage zones do not tend towards saturation of the crystal after several successive storage operations. In the diagram, two possible reference beam trajectories have been shown, one undeflected by the optical deflector having been shown in broken line, the optical axis of the beam being normal to the face 15, and the other, deflected by the deflector having been shown in full line. Moreover, the device illustrated utilizes an electro-optical deflector but, by using a slightly different device upstream and downstream of the deflector, it is possible to replace the deflector, for example, by an acousto-optical deflector. It is equally possible to use a mechanical deflector. It should be noted that the control devices which have to be associated with the deflector have not been shown in the diagram.

The invention is not limited to the embodiment shown in the drawing, in particular, having recorded the maximum number of images in the manner described in accordance with the invention, using two faces which are mutually at right-angles for the entry faces respectively of object radiation and reference radiation, it is possible, for example by rotating the cuboid storage material about the optical axis of the object beam through ($\pi/2$), to superimpose upon the previously recorded holograms other holograms obtained by interference between object beams transmitted through other object planes and a reference beam successively occuping the same positions as before.

It is also possible in the case where the storage material used is an electro-optical crystal of photosensitive kind, to short-circuit all the faces of the crystal by depositing upon said faces transparent electrodes which are connected together, the axis $\vec{C}$ being arranged at 45° to the radiation entry faces as represented by the arrow in dotted lines in FIG. 3 so that the photo-induced variations in refractive index occur about a constant mean value.

It is equally possible to utilize a storage device of this kind not to increase the number of points which can be stored but to increase the signal-to-noise ratio of the reconstructed images obtained from a relatively small number of superimposed holograms, the angular separation between two successive positions of the reference beam having been made very substantially larger than the minimum angular selectivity required for correct reconstruction.

What we claim is:

1. A multiple bulk optical holographic storage device, comprising:
    a thick photosensitive electro-optical material capable of storing information by the photovoltaic effect, and having reference and object faces forming a right angle;
    a source of monochromatic light;
    means for splitting the monochromatic light into first and second beams;
    means for forming the first beam into a collimated reference beam impinging onto the reference face with a variable optical axis with respect thereto;
    a convergent optical element;
    means for passing the second beam through the convergent optical element to form an object beam impinging on the object face without any zero-order stop;
    means interposed between the convergent optical element and the object face for modulating the object beam with information to be recorded within the electro-optical material, the modulated object and reference beams interfering within the material so as to be recorded as variations in refractive index within the material; and
    transparent electrodes attached to all of the faces of said material and electrically short circuited to one another so as to maintain a zero electrical potential difference therebetween to prevent elementary storage zones of said material from tending toward saturation after several successive storage operations.

2. A device according to claim 1 wherein the electro-optical material is in the form of a cube.

3. A device according to claim 2 further comprising means for orienting the cube of electro-optical material including means for rotating the cube through $\pi/2$ radians about the optical axis of the object beam.

4. A device according to claim 1, wherein the electro-optical material is a photo-sensitive electro-optical crystal in which charges are photo-induced, the crystal having an axis of migration of photo-induced charges that is oriented at 45° to an entry face of the crystal.

5. A multiple bulk optical holographic storage device, comprising:
    a thick photosensitive electro-optical material capable of storing information by the photovoltaic effect, and having reference and object faces forming a right angle;
    a source of monochromatic light;
    means for splitting the monochromatic light into first and second beams;
    means for forming the first beam into a collimated reference beam impinging onto the reference face at a right angle thereto;
    a convergent optical element;
    means for passing the second beam through the convergent optical element to form an object beam impinging on the object face without any zero-order stop;
    means interposed between the convergent optical element and the object face for modulating the object beam with information to be recorded within the electro-optical material, the modulated object and reference beams interfering within the material so as to be recorded as variations in refractive index within the material; and
    transparent electrodes attached to all of the faces of said material and electrically short circuited to one another so as to maintain a zero electrical potential difference therebetween to prevent elementary storage zones of said material from tending toward saturation after several successive storage operations.

6. A device according to claim 5 wherein the electro-optical material is a photosensitive electro-optical crystal in which charges are photo-induced, the crystal having an axis of migration of photo-induced charges that is parallel to either the optical axis of the convergent object beam impinging on the object face or the mean optical axis of the reference beam.

* * * * *